United States Patent [19]

El-Hamamsy et al.

[11] Patent Number: 5,479,102
[45] Date of Patent: Dec. 26, 1995

[54] SIMULATED LOAD CIRCUIT FOR SIMULATING THE ARC IMPEDANCE OF AN ELECTRODLESS DISCHARGE LAMP

[75] Inventors: Sayed-Amr A. El-Hamamsy, Schenectady, N.Y.; Michael M. Secen, Mentor, Ohio; Mark E. Duffy, Shaker Heights, Ohio; Gerald E. Duffy, Mentor, Ohio

[73] Assignee: General Electric Company, Schenectady, N.Y.

[21] Appl. No.: 229,990

[22] Filed: Apr. 19, 1994

Related U.S. Application Data

[62] Division of Ser. No. 904,287, Jun. 25, 1992, Pat. No. 5,332,970.

[51] Int. Cl.$^6$ ............................................. G01R 31/24
[52] U.S. Cl. ........................ 324/414; 315/285; 315/248; 324/601
[58] Field of Search ............................. 324/409, 403, 324/414, 408, 601, 649, 654–657; 315/39, 248, 285, 344

[56] References Cited

U.S. PATENT DOCUMENTS

| | | | |
|---|---|---|---|
| 2,626,981 | 1/1953 | Shiepe | 324/654 |
| 2,932,789 | 4/1960 | Drubin et al. | 324/655 X |
| 3,906,340 | 9/1975 | Wingfield et al. | 324/655 X |
| 3,932,806 | 1/1976 | Kawada | 324/656 X |
| 3,956,693 | 5/1976 | Zutrauen et al. | 324/207.16 X |
| 4,114,606 | 9/1978 | Seylar | 324/655 X |
| 4,419,623 | 12/1983 | Ketchledge | 324/655 X |
| 4,482,858 | 11/1984 | Plichta | 324/654 |
| 4,672,316 | 6/1987 | Ettel | 324/202 |
| 4,695,803 | 9/1987 | Rue | 324/414 X |
| 4,730,163 | 3/1988 | Santos | 324/414 |
| 4,783,615 | 11/1988 | Dakin . | |
| 4,812,702 | 3/1989 | Anderson . | |
| 5,023,566 | 6/1991 | El-Hamamsy et al. . | |
| 5,039,903 | 8/1991 | Farrall . | |
| 5,047,692 | 9/1991 | Borowiec et al. . | |
| 5,086,276 | 2/1992 | Li et al. | 324/414 |

Primary Examiner—Sandra L. O'Shea
Assistant Examiner—Warren S. Edmonds
Attorney, Agent, or Firm—Jill M. Breedlove; Marvin Snyder

[57] ABSTRACT

A simulated load circuit for measuring the impedance of the arc discharge of an electrodeless discharge lamp of the type having an arc tube and an excitation coil for exciting the arc discharge in an ionizable fill contained therein includes: a secondary coil spaced apart from the excitation coil by a distance which is varied in order to vary the coupling coefficient between the secondary coil and the excitation coil; a fixed load resistance coupled to the secondary coil; and a variable matching network coupled in series or parallel with the load resistance, the impedance of the matching network being varied in order to vary the ratio of reactance to resistance of the load circuit. The distance between the secondary coil and the excitation coil is varied, and the impedance of the matching network is varied, until the input impedance of the load circuit is substantially equivalent to the operating impedance of the lamp. The simulated load circuit is useful for designing and testing ballast circuits for electrodeless discharge lamps and for providing measurements of arc discharge power and excitation coil efficiency.

5 Claims, 4 Drawing Sheets

SIMULATED LOAD CIRCUIT FOR SIMULATING THE ARC IMPEDANCE OF AN ELECTRODELESS DISCHARGE LAMP

This application is a division, of application Ser. No. 07/904,287, filed Jun. 25, 1992 now U.S. Pat. No. 5,332,970.

FIELD OF THE INVENTION

The present invention relates generally to electrodeless discharge lamps and, more particularly, to a method and circuit for measuring the impedance of the plasma discharge of such a lamp (e.g., a high intensity discharge lamp) and to a simulated load for the lamp ballast useful in the production and testing thereof.

BACKGROUND OF THE INVENTION

In a high intensity discharge (HID) lamp, a medium to high pressure ionizable gas, such as mercury or sodium vapor, emits visible radiation upon excitation typically caused by passage of current through the gas. One class of HID lamps comprises electrodeless lamps which generate an arc discharge by generating a solenoidal electric field in a high-pressure gaseous lamp fill. In particular, the lamp fill, or discharge plasma, is excited by radio frequency (RF) current in an excitation coil surrounding an arc tube. The arc tube and excitation coil assembly acts essentially as a transformer which couples RF energy to the plasma. That is, the excitation coil acts as a primary coil, and the plasma functions as a single-turn secondary. RF current in the excitation coil produces a time-varying magnetic field, in turn creating an electric field in the plasma which closes completely upon itself, i.e., a solenoidal electric field. Current flows as a result of this electric field, resulting in a toroidal arc discharge in the arc tube.

In developing high-efficiency RF circuits to drive an electrodeless lamp, such as an electrodeless HID lamp, it is desirable to accurately determine the values of the plasma impedance and the coupling coefficient between the excitation coil and the lamp. Of course, since there are no electrodes, the impedance cannot be directly determined using arc voltage and current measurements. Therefore, it is desirable to provide an indirect method for measuring the plasma impedance and furthermore to provide a simulated load circuit for designing and testing ballast circuits for electrodeless discharge lamps.

SUMMARY OF THE INVENTION

A simulated load circuit for measuring the impedance of the arc discharge of an electrodeless discharge lamp of the type having an arc tube and an excitation coil for exciting an arc discharge in an ionizable fill contained therein comprises: a secondary coil spaced apart from the excitation coil by a distance which is varied in order to vary the coupling coefficient between the secondary coil and the excitation coil; a fixed load resistance coupled to the secondary coil; and a variable matching network coupled in series or parallel with the load resistance, the impedance of the matching network being varied in order to vary the ratio of reactance to resistance of the load circuit. According to the present invention, the distance between the secondary coil and the excitation coil is varied, and the impedance of the matching network is varied, until the input impedance of the simulated load circuit is substantially equivalent to the impedance of the arc discharge during lamp operation.

Advantageously, the simulated load circuit described herein is useful for designing and testing ballast circuits for electrodeless discharge lamps. Furthermore, the simulated load circuit is useful for providing measurements of arc discharge power and excitation coil efficiency.

BRIEF DESCRIPTION OF THE DRAWINGS

The features and advantages of the present invention will become apparent from the following detailed description of the invention when read with the accompanying drawings in which:

FIG. 5b is a top view of a secondary coil useful in the implementation of FIG. 5a.

DETAILED DESCRIPTION OF THE INVENTION

Figure 1:
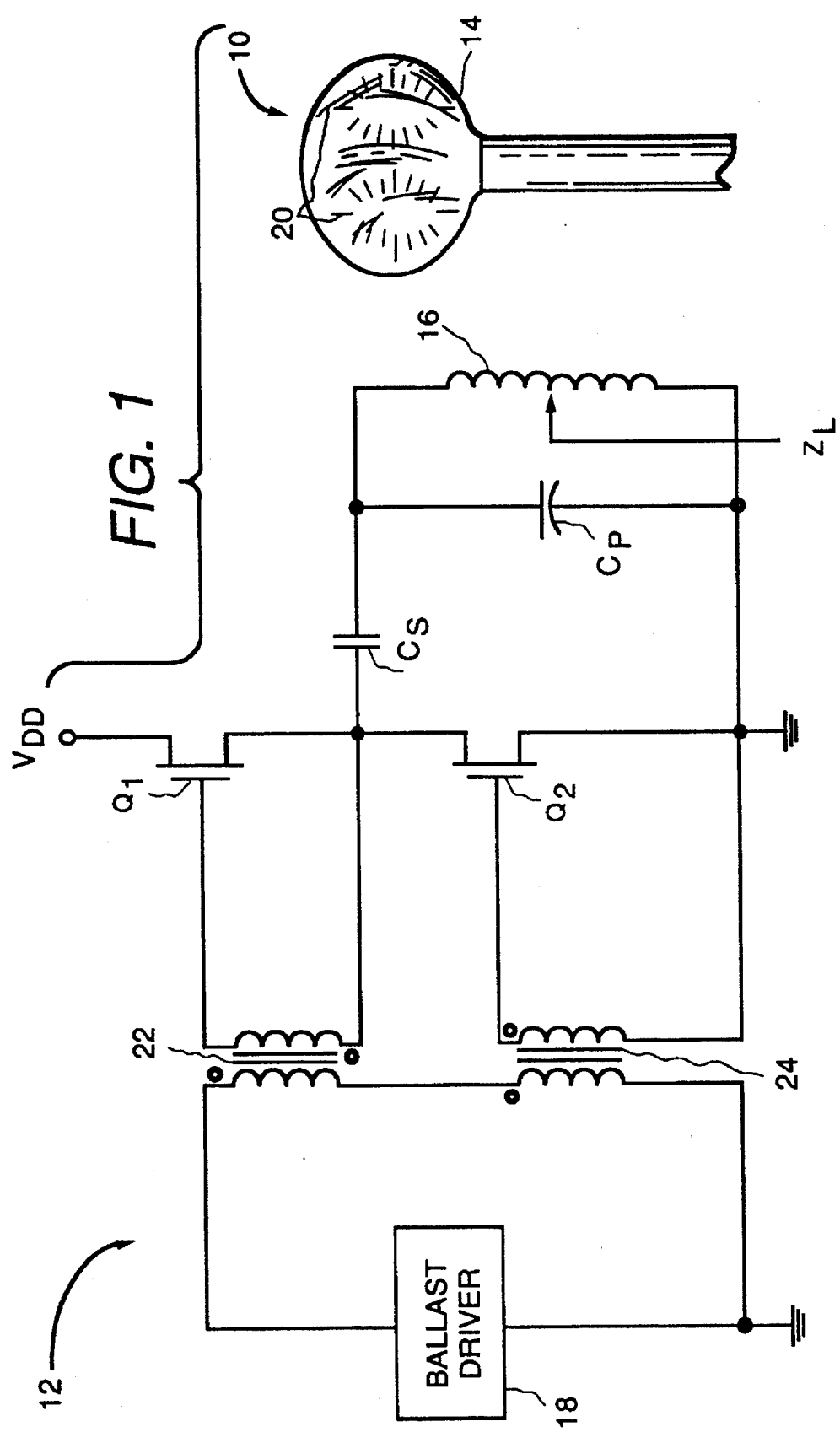
FIG. 1 schematically illustrates a typical electrodeless HID lamp system.

FIG. 1 illustrates an exemplary HID lamp system. (Although the invention is described herein with reference to an electrodeless HID lamp, it is to be understood that the principles of the invention apply to other types of electrodeless lamps, such as electrodeless fluorescent lamps.) As shown, HID lamp 10 includes an arc tube 14 formed of a high-temperature glass, such as fused quartz, or an optically transparent or translucent ceramic, such as polycrystalline alumina. Arc tube 14 contains a fill which may comprise at least one metal halide, such as sodium iodide, and a buffer gas, such as xenon.

Electrical power is applied to the HID lamp by an excitation coil 16 disposed about arc tube 14 which is driven by an RF signal via a ballast driver 18 and a ballast 12. (For clarity of illustration, coil 16 is not shown in its operational position about arc tube 14.) A suitable excitation coil 16 may comprise, for example, a two-turn coil having a configuration such as that described in commonly assigned U.S. Pat. No. 5,039,903 of G. A. Farrall, issued Aug. 13, 1991 and incorporated by reference herein. Such a coil configuration results in very high efficiency and causes only minimal blockage of light from the lamp. The overall shape of the excitation coil of the Farrall patent is generally that of a surface formed by rotating a bilaterally symmetrical trapezoid about a coil center line situated in the same plane as the trapezoid, but which line does not intersect the trapezoid. However, another suitable coil configuration is described in commonly assigned U.S. Pat. No. 4,812,702 of J. M. Anderson, issued Mar. 14, 1989, which patent is incorporated by reference herein. In particular, the Anderson patent describes a coil having six turns which are arranged to have a substantially V-shaped cross section on each side of a coil center line. Still another suitable excitation coil may be of solenoidal shape, for example.

In operation, RF current in coil 16 results in a time-varying magnetic field which produces within arc tube 14 an electric field that completely closes upon itself. Current flows through the fill within arc tube 14 as a result of this solenoidal electric field, producing a toroidal arc discharge 20 in arc tube 14. The operation of an exemplary HID lamp is described in commonly assigned Dakin U.S. Pat. No. 4,783,615, issued on Nov. 8, 1988, which is incorporated by reference herein.

In FIG. 1, ballast 12 is illustrated as comprising a Class-D power amplifier. However, it is to be understood that the present invention is not limited to Class-D ballasts, but may apply to any other suitable ballast for an electrodeless HID lamp. As shown, ballast 12 includes two switching devices $Q_1$ and $Q_2$ connected in series with a dc power supply $V_{DD}$ in a half-bridge configuration. Switching devices $Q_1$ and $Q_2$ are illustrated as MOSFET's, but other types of switching devices having capacitive gates may be used, such as insulated gate bipolar transistors (IGBT's) or MOS-controlled thyristors (MCT's). Switching devices $Q_1$ and $Q_2$ are coupled to ballast driver 18 via input isolation transformers 22 and 24, respectively. In operation, the switching devices are driven alternately between cutoff and saturation such that one is conducting while the other one is turned off and vice versa. Hence, the Class-D ballast may be conveniently driven by a square wave signal. Alternatively, ballast driver 18 may comprise means for generating two out-of-phase sinusoidal signals, as described in commonly assigned U.S. Pat. No. 5,023,566 of S. A. El-Hamamsy and G. Jernakoff, issued Jun. 11, 1991 and incorporated by reference herein.

As in any Class-D circuit, a resonant load network is connected to the half-bridge at the junction between switching devices $Q_1$ and $Q_2$. Such a resonant load network may comprise a series, parallel or series/parallel resonant circuit, depending on the application. In the HID lamp system illustrated in FIG. 1, the resonant load network includes a series capacitor $C_s$ which is employed both for resonant circuit tuning and blocking dc voltage. Capacitor $C_s$ is connected in series with the parallel combination of the excitation coil 16 of HID lamp 10 and a parallel tuning capacitor $C_p$. The parallel combination of capacitor $C_p$ and coil 16 functions as an impedance transformer to reflect the impedance of the arc discharge 20 into the ballast load.

As described in commonly assigned U.S. Pat. No. 5,047,692 of J. C. Borowiec and S. A. El-Hamamsy, issued Sep. 10, 1991 and incorporated by reference herein, capacitors $C_s$ and $C_p$ are chosen to ensure impedance matching for maximum efficiency. That is, these capacitors are chosen to ensure that the ballast load is designed for optimum values of resistance and phase angle. As described hereinabove, the excitation coil of the HID lamp acts as the primary of a loosely-coupled transformer, while the arc discharge acts as both a single-turn secondary and secondary load. The impedance of the arc discharge is reflected to the primary, or excitation coil, side of this loosely-coupled transformer. To match the ballast load impedance for maximum efficiency, the parallel capacitor operates with the excitation coil to match the proper resistive load value, and the series capacitor acts with the combination of the excitation coil and parallel capacitor to yield the required phase angle.

Figure 2:
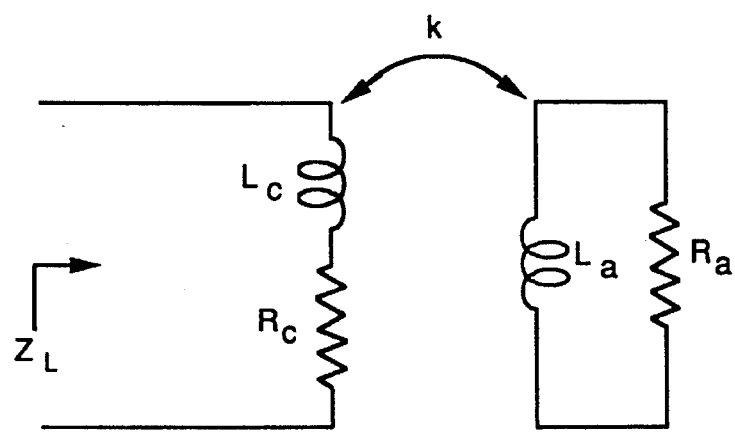
FIG. 2 schematically illustrates the equivalent load circuit for the lamp system of FIG. 1.

FIG. 2 illustrates the equivalent load circuit of the system of FIG. 1. In FIG. 2, $R_c$ represents the coil resistance; $L_c$ represents the coil inductance; $R_a$ represents the arc resistance; and $L_a$ represents the arc inductance. The impedance $Z_L$ of the excitation coil and the reflected arc load are represented as follows:

$$Z_L = R_c + k^2 X_c X_a \frac{R_a}{R_a^2 + X_a^2} + \tag{1}$$

$$j\left( X_c - k^2 X_c \frac{X_a^2}{R_a^2 + X_a^2} \right)$$

where k is the coupling coefficient between the excitation coil and the arc discharge; the arc reactance $X_a = \omega L_a$; and the coil reactance $X_c = \omega L_c$, $\omega$ being the frequency of operation. Equation (1) may be rewritten as:

$$Z_L = R_c + k^2 X_{c_1} \frac{Q_a}{1+Q_a^2} + j\left( X_c - k^2 X_{c_1} \frac{Q_a^2}{1+Q_a^2} \right) \tag{2}$$

where $$Q_a = \frac{X_a}{R_a}$$

is the ratio of arc reactance to arc resistance. From equation (2), it is apparent that to determine the arc impedance, it is sufficient to determine the coupling coefficient k and the ratio $Q_a$. Advantageously, since only the ratio $Q_a$ is required, and not element values, a convenient resistance value, e.g., 50 ohms (i.e., the resistance of standard coaxial cables), may be chosen for the simulated load.

Figure 3:
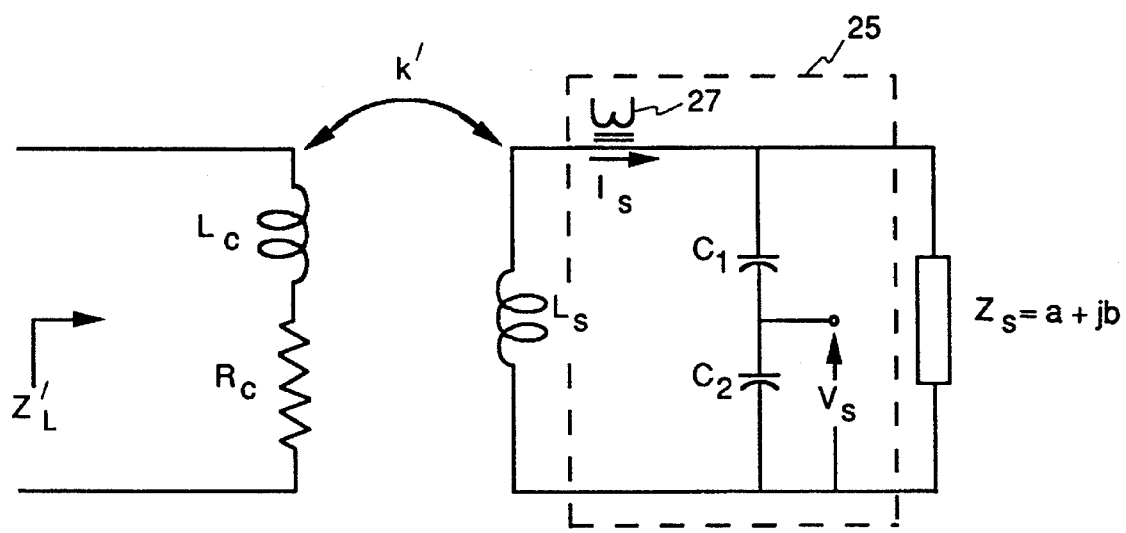
FIG. 3 schematically illustrates the simulated load circuit of the present invention.

FIG. 3 schematically illustrates a simulated load circuit according to the present invention for measuring the impedance of the arc discharge of an electrodeless HID lamp. In FIG. 3, $L_s$ represents the inductance of a secondary coil spaced apart from the excitation coil, as described hereinbelow; $Z_s = a + jb$ represents the load impedance as viewed from the terminals of the secondary coil; and k' represents the coupling coefficient between excitation coil $L_c$ and the secondary coil $L_s$. A measurement block 25 situated between secondary coil $L_s$ and the load $Z_s$ includes a simple current transformer 27 and a capacitive divider comprising capacitors $C_1$ and $C_2$. Current transformer 27 provides a measure of the load current $I_s$; and a measurement of the load voltage $V_s$ is taken across capacitor $C_2$, as shown. In FIG. 3, the values of the elements comprising the measurement block are chosen so as not to substantially affect the impedance as seen from the secondary coil $L_s$.

According to a preferred embodiment, the impedance $Z_s$ includes a fixed load resistance, a matching network, and electrical leads. The matching network may comprise a variable capacitor and/or a variable inductor. Since variable capacitors are more readily available and are easy to use, the preferred embodiment of the matching network comprises a variable capacitor. The impedance $Z_L'$ of the simulated load circuit may be represented as follows:

$$Z_L' = R_c + k^2 X_c X_s \frac{a}{a^2 + (X_s+b)^2} + \tag{3}$$

$$j\left( X_c - k^2 X_c X_s \frac{X_s+b}{a^2 + (X_s+b)^2} \right)$$

where the secondary coil reactance $X_s = \omega L_s$. Equation (3) may be rewritten as follows:

$$Z_L' = R_c + k^2 X_c \frac{X_s}{X_s+b} \frac{Q_a'}{1+Q_a'^2} + \tag{4}$$

-continued $$j\left(X_c - k'^2 X_c \frac{X_s}{X_s+b} \frac{Q_a'^2}{1+Q_a'^2}\right)$$

where $$Q_a' = \frac{X_s+b}{a}$$

represents the ratio of reactance to resistance of the simulated load circuit and $Q_a' > 0$.

To achieve impedance matching, the impedance $Z_L'$ of the simulated load circuit must equal the impedance $Z_L$ during lamp operation. Hence, equating the real and imaginary parts, respectively, of equations (2) and (4) results in the following relationships:

$$k^2 = k'^2 \frac{X_s}{X_s+b} \quad (5)$$

$$Q_a = Q_a' \quad (6)$$

where $k^2 > 0$ since the coupling coefficient cannot be complex.

To solve equations (5) and (6), a and b may be determined analytically by calculating the impedance of the matching network as viewed from the secondary coil. Alternatively, a and b may be determined from measurements of the magnitude and phase of the current $I_s$ and voltage $V_s$ at the input to the load $Z_s$ (i.e., at the output of coil $L_s$).

Figure 4A:
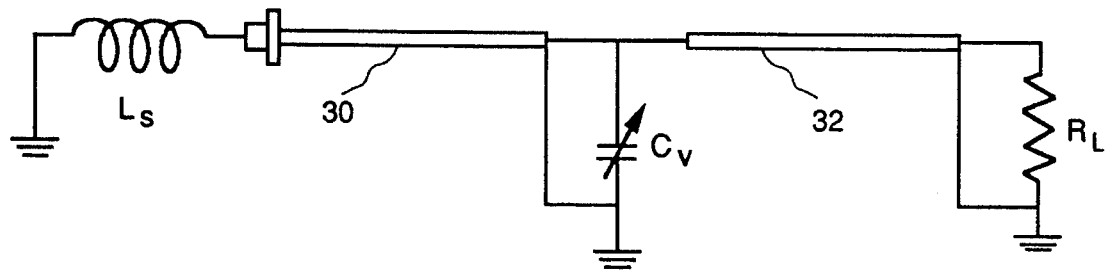
FIGS. 4a and 4b schematically illustrate alternative configurations of the simulated load circuit of FIG. 3.
Figure 4B:
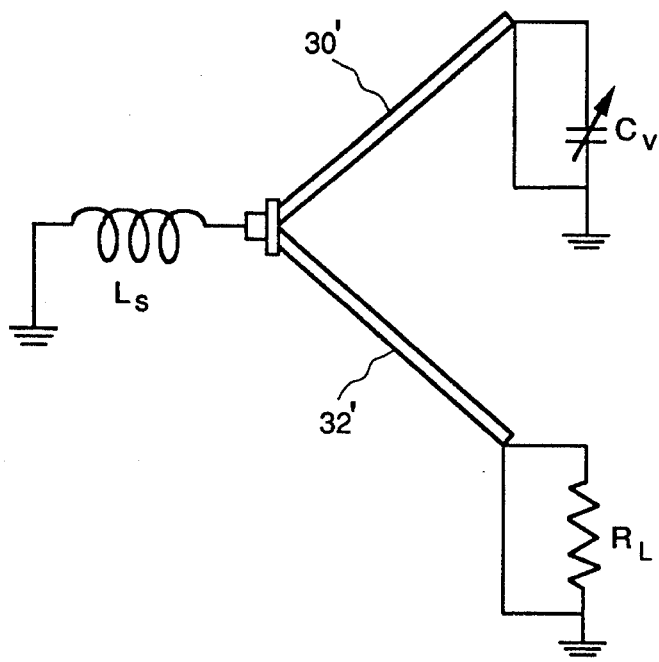

FIGS. 4a and 4b illustrate alternative configurations for the simulated load circuit of the present invention. In FIG. 4a, the secondary coil $L_s$ is connected via measurement block 25 and then a first coaxial cable 30 to the matching network (shown as comprising a variable capacitor $C_v$) which is, in turn, coupled in parallel with the fixed load resistance $R_L$ via a second coaxial cable 32. Preferably, the value of load resistance $R_L$ is equal to the resistance of coaxial cables 30 and 32 in order to provide proper line terminations. In FIG. 4b, the secondary coil $L_s$ is coupled via two separate coaxial cables 30' and 32' to the variable capacitor $C_v$ and the fixed -resistance $R_L$, respectively. Still other load circuit configurations are possible. In particular, a load circuit may be constructed which utilizes a variable resistance in place of fixed resistance $R_L$. For each load circuit configuration, the impedance as viewed from the secondary coil $L_s$ is different.

Figure 5A:
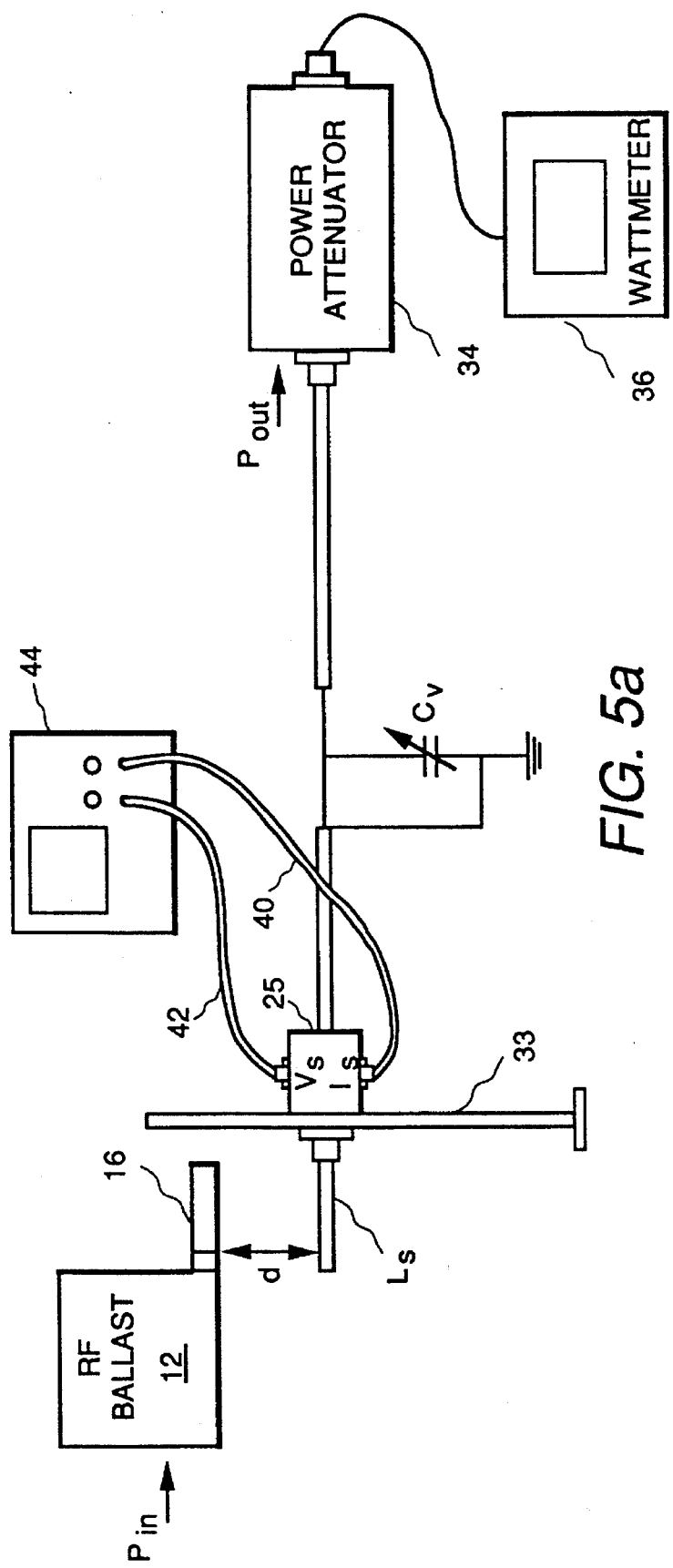
FIG. 5a schematically illustrates a preferred implementation of a simulated load circuit of the present invention.
Figure 5B:
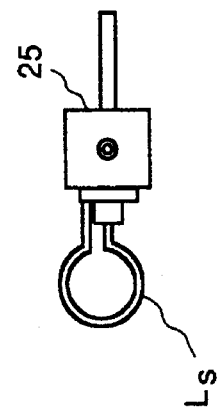

FIG. 5a illustrates a preferred implementation of the simulated load circuit of the present invention. As shown, secondary coil $L_s$ is situated a variable distance d from excitation coil 16. A top view of secondary coil $L_s$ is shown in FIG. 5b. Secondary coil $L_s$ is mounted on an adjustable fixture 33 such that the distance d may be changed easily. In particular, by changing the distance d between the coils 16 and $L_s$, the coupling coefficient k' therebetween changes accordingly. Preferably, the fixture has a scale thereon for providing coupling coefficient values k' corresponding to a range of distances d. The load resistance $R_L$ is shown in FIG. 5a as being provided by a power attenuator 34 (e.g., 50 ohms, −40 dB). A wattmeter 36, such as, for example, a Hewlett Packard model 435a micro-wattmeter, is connected to the power attenuator. The variable capacitor $C_v$ may comprise, for example, an air variable capacitor having a range, for example, from approximately 5 pF to approximately 1000 pF. The outputs $I_s$ and $V_s$ from measurement block 25 are appropriately terminated via coaxial cables 40 and 42 at an oscilloscope 44.

In operation, the distance d between the excitation coil and the secondary coil is varied, and the impedance of the matching capacitor $C_v$ is varied, until the impedance of the simulated load circuit is substantially equivalent to that of the lamp during operation thereof. At that point, the coupling coefficient k' and the ratio $Q_a'$ may be determined, and thus the corresponding values of the coupling coefficient k and the ratio $Q_a$ are determined from equations (5) and (6) hereinabove.

In particular, the coupling coefficient k' between the secondary coil $L_s$ and the excitation coil may be measured by short circuiting the secondary coil and using the standard formula for the coupling coefficient, as follows:

$$k' = \sqrt{1 - \frac{L_{css}}{L_c}}$$

where $L_{css}$ represents the inductance of the excitation coil with the secondary coil $L_s$ short-circuited. The ratio $Q_a'$ may then be derived analytically or measured directly as described hereinabove. Substituting into equations (5) and (6) yields the values of k and $Q_a$ for the arc discharge.

Advantageously, the simulated load circuit of FIG. 5a can be used to make other measurements. For example, the power delivered to the arc $P_{out}$ can be measured directly using wattmeter 36. Moreover, the coupling efficiency of the excitation coil as a ratio of arc power $P_{out}$ to input power $P_{in}$ can also be accurately determined using the simulated load circuit of the present invention.

As another advantage, the simulated load circuit of the present invention is useful for testing and tuning HID lamp ballasts during development and production. In particular, by using the simulated load circuit, it is unnecessary to perform (or even develop) a lamp starting procedure until after the ballast is tested and tuned.

While the preferred embodiments of the present invention have been shown and described herein, it will be obvious that such embodiments are provided by way of example only. Numerous variations, changes and substitutions will occur to those of skill in the art withoun departing from the invention herein. Accordingly, it is intended that the invention be limited only by the spirit and scope of the appended claims.

What is claimed is:

1. A simulated load circuit for coupling to a lamp ballast and simulating the impedance of an arc discharge of an electrodeless discharge lamp of the type having an arc tube having an ionizable fill contained therein and an excitation coil for exciting an arc discharge in said tube, comprising:

a secondary coil spaced apart from said excitation coil, the distance between said secondary coil and said excitation coil being variable in order to vary the coupling coefficient between said secondary coil and said excitation coil;

a load resistance electrically connected to said secondary coil; and a variable mashing network electrically connected to said load resistance, the impedance of said matching network being variable in order to vary the ratio of reactance to resistance of the simulated load circuit;

the combined impedance of the excitation coil and the simulated load circuit being substantially equivalent to a predetermined combined impedance of the excitation coil and the arc discharge when operating the lamp.

2. The simulated load circuit of claim 1 wherein said variable matching network comprises a variable capacitor.

3. The simulated load circuit of claim 1 wherein said load resistance is fixed.

4. The simulated load circuit of claim 3 wherein said fixed load resistance and said variable matching network are coupled to said secondary coil via coaxial cable means, said fixed load resistance having substantially the same resistance value as said coaxial cable means.

5. The simulated load circuit of claim 1, further comprising measuring means for providing measurements of the current supplied to and the voltage across said load circuit.

* * * * *